US011784189B2

(12) United States Patent
Hebert et al.

(10) Patent No.: US 11,784,189 B2
(45) Date of Patent: Oct. 10, 2023

(54) MONOLITHIC INTEGRATION OF DIVERSE DEVICE TYPES WITH SHARED ELECTRICAL ISOLATION

(71) Applicant: GLOBALFOUNDRIES U.S. Inc., Malta, NY (US)

(72) Inventors: Francois Hebert, San Mateo, CA (US); Handoko Linewih (SG)

(73) Assignee: GlobalFoundries U.S. Inc., Malta, NY (US)

( * ) Notice: Subject to any disclaimer, the term of this patent is extended or adjusted under 35 U.S.C. 154(b) by 7 days.

(21) Appl. No.: 17/407,680

(22) Filed: Aug. 20, 2021

(65) Prior Publication Data

US 2023/0059665 A1    Feb. 23, 2023

(51) Int. Cl.
*H01L 27/12*     (2006.01)
*H01L 21/84*     (2006.01)
*H01L 27/085*    (2006.01)
*H01L 29/872*    (2006.01)

(52) U.S. Cl.
CPC ........... *H01L 27/1203* (2013.01); *H01L 21/84* (2013.01); *H01L 27/085* (2013.01); *H01L 29/872* (2013.01)

(58) Field of Classification Search
CPC .... H01L 27/1203; H01L 21/84; H01L 27/085; H01L 29/7786; H01L 29/7787; H01L 29/872; H01L 29/1066
USPC ........................................................ 438/105
See application file for complete search history.

(56) References Cited

U.S. PATENT DOCUMENTS

| | | | |
|---|---|---|---|
| 7,247,889 B2 | 7/2007 | Hanson et al. |
| 7,666,765 B2 | 2/2010 | Cheng et al. |
| 8,120,060 B2 | 2/2012 | Fitzgerald |
| 8,212,294 B2 | 7/2012 | Hoke et al. |
| 8,242,510 B2 | 8/2012 | Hebert |
| 8,665,013 B2 | 3/2014 | Saunders |

(Continued)

OTHER PUBLICATIONS

DeCoutere, "TUTORIAL: All-GaN GaN-ICs in the IMEC's GaN-on-SOI technology", IMEC Aug. 2019, retrieved from the internet at https://europractice-ic.com/wp-content/uploads/2019/09/Tutorial-AllGaN-GaN-ICs_imec_Aug2019.pdf.
J. Ren, C. Liu, C. W. Tang, K. M. Lau and J. K. O. Sin, "A Novel Si-GaN Monolithic Integration Technology for a High-Voltage Cascoded Diode," in IEEE Electron Device Letters, vol. 38, no. 4, pp. 501-504, Apr. 2017.

(Continued)

*Primary Examiner* — Thinh T Nguyen
(74) *Attorney, Agent, or Firm* — Thompson Hine LLP; Francois Pagette

(57) ABSTRACT

Structures including III-V compound semiconductor-based devices and silicon-based devices integrated on a semiconductor substrate and methods of forming such structures. The structure includes a substrate having a device layer, a handle substrate, and a buried insulator layer between the handle substrate and the device layer. The structure includes a first semiconductor layer on the device layer in a first device region, and a second semiconductor layer on the device layer in a second device region. The first semiconductor layer contains a III-V compound semiconductor material, and the second semiconductor layer contains silicon. A first device structure includes a gate structure on the first semiconductor layer, and a second device structure includes a doped region in the second semiconductor layer. The doped region and the second semiconductor layer define a p-n junction.

13 Claims, 10 Drawing Sheets

(56) References Cited

U.S. PATENT DOCUMENTS

| | | |
|---|---|---|
| 8,866,190 B2 | 10/2014 | Briere |
| 9,219,058 B2 | 12/2015 | Briere |
| 2011/0180857 A1 | 7/2011 | Hoke et al. |
| 2014/0367744 A1 | 12/2014 | Briere |
| 2021/0234030 A1* | 7/2021 | Sun et al. .......... H01L 29/7787 |
| 2022/0029008 A1* | 1/2022 | Yang et al. ........ H01L 29/7786 |

OTHER PUBLICATIONS

J. W. Chung, B. Lu and T. Palacios, "On-Wafer Seamless Integration of GaN and Si (100) Electronics," 2009 Annual IEEE Compound Semiconductor Integrated Circuit Symposium, 2009, pp. 1-4.

Li et al., "Monolithically Integrated GaN Power ICs" Compound Semiconductor, May 18, 2020. Retrieved from the internet at https://compoundsemiconductor.net/article/111292/Monolithically_integrated_GaN_power_ICs/feature.

Y. Yamashita, S. Stoffels, N. Posthuma, S. Decoutere and K. Kobayashi, "Monolithically Integrated E-mode GaN-on-SOI Gate Driver with Power GaN-HEMT for MHz-Switching," 2018 IEEE 6th Workshop on Wide Bandgap Power Devices and Applications (WiPDA), 2018, pp. 231-236.

\* cited by examiner

MONOLITHIC INTEGRATION OF DIVERSE DEVICE TYPES WITH SHARED ELECTRICAL ISOLATION

BACKGROUND

The present invention relates to semiconductor device fabrication and integrated circuits and, more specifically, to structures including III-V compound semiconductor-based devices and silicon-based devices integrated on a semiconductor substrate and methods of forming such structures.

High-voltage power electronic devices, such as high-electron-mobility transistors, may be fabricated using III-V compound semiconductors to exploit their material properties, such as a carrier mobility that is greater than the carrier mobility of silicon and a wider band gap than silicon. III-V compound semiconductors include Group III elements (aluminum, gallium, indium) and Group V elements (nitrogen, phosphorus, arsenic, antimony) combined with the Group III elements. A common III-V compound semiconductor used as a based material in constructing devices is gallium nitride. A high-electron-mobility transistor may include a heterojunction between crystalline III-V compound semiconductor materials having different band gaps, such as a heterojunction between binary gallium nitride and trinary aluminum-gallium nitride. During operation, a two-dimensional electron gas is formed near an interface at the heterojunction and defines the channel of the high-electron-mobility transistor.

The integration of high-electron-mobility transistors with silicon-based devices, such as field-effect transistors or heterojunction bipolar transistors, on the same chip has proven to be challenging. Integration may be achieved by wafer bonding or through the use of hybrid substrates with sections of different crystalline orientations, which by their nature lend significant complexity to processes integrating high-electron-mobility transistors with these other types of transistors.

Improved structures including III-V compound semiconductor-based devices and silicon-based devices integrated on a semiconductor substrate and methods of forming such structures are needed.

SUMMARY

In an embodiment of the invention, a structure includes a substrate having a device layer, a handle substrate, and a buried insulator layer between the handle substrate and the device layer. The structure includes a first semiconductor layer on the device layer in a first device region, and a second semiconductor layer on the device layer in a second device region. The first semiconductor layer is comprised of a III-V compound semiconductor material, and the second semiconductor layer is comprised of silicon. A first device structure includes a gate structure on the first semiconductor layer, and a second device structure includes a doped region in the second semiconductor layer. The doped region and the second semiconductor layer define a p-n junction.

In an embodiment of the invention, a structure includes a substrate including a device layer, a handle substrate, and a buried insulator layer between the handle substrate and the device layer. The structure includes a semiconductor layer on the device layer in a first device region, a first device structure including gate structure on the semiconductor layer, and a second device structure including a doped region in a second device region of the device layer. The device layer is comprised of single-crystal silicon, and the semiconductor layer is comprised of a III-V compound semiconductor material. The doped region and the device layer define a p-n junction.

In an embodiment of the invention, a method includes providing a substrate including a device layer, a handle substrate, and a buried insulator layer between the handle substrate and the device layer, forming a first semiconductor layer on a first device region of the device layer, and forming a second semiconductor layer on a second device region of the device layer. The first semiconductor layer is comprised of a III-V compound semiconductor material, and the second semiconductor layer is comprised of silicon. The method further includes forming a first device structure having gate structure on the first semiconductor layer, and forming a second device structure having a doped region in the second semiconductor layer. The doped region and the second semiconductor layer define a p-n junction.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
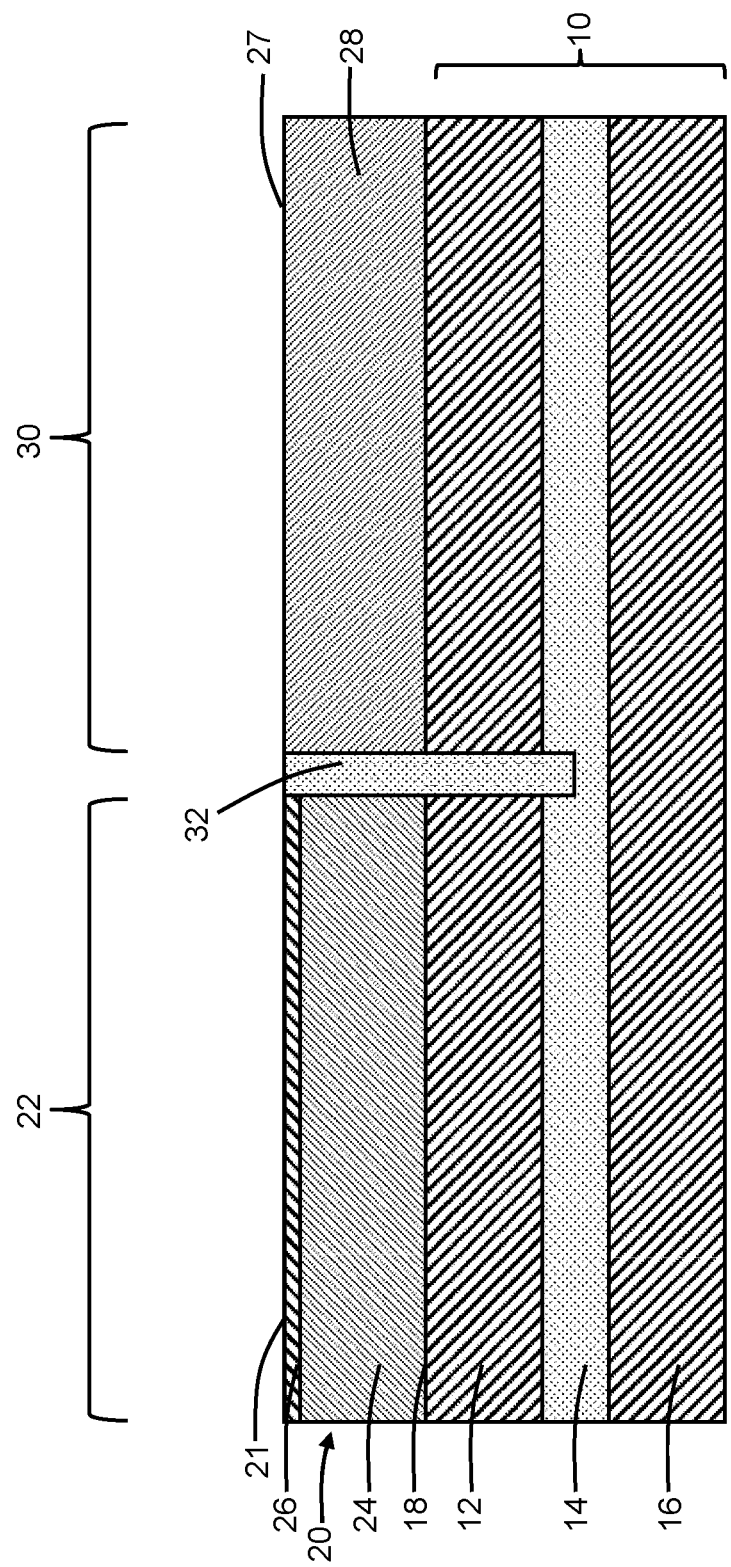
FIG. 1 is a cross-sectional view of a structure at an initial fabrication stage in accordance with embodiments of the invention.

With reference to FIG. 1 and in accordance with embodiments of the invention, a substrate 10 is provided that has a substrate stack that includes a device layer 12, a buried insulator layer 14, and a handle substrate 16. The device layer 12 is separated from the handle substrate 16 by the intervening buried insulator layer 14. The device layer 12 has a top surface 18, which may be planar. The buried insulator layer 14 may be constituted by a buried oxide (BOX) layer that is comprised of a layer of a solid dielectric material, such as silicon dioxide.

The device layer 12 and the handle substrate 16 may contain a semiconductor material, such as single-crystal silicon. In an embodiment, the single-crystal semiconductor material of the device layer 12 may have a diamond crystal lattice structure with a <111> crystal orientation as specified by Miller indices. In an embodiment, the substrate 10 may contain single-crystal silicon with a diamond crystal lattice structure having a <111> crystal orientation. For a device layer 12 having a <111> crystal orientation, the (111) crystallographic plane is parallel to the top surface 18 of the device layer 12, and the [111] crystallographic direction is normal to the (111) plane. The (100) crystallographic axes do not lie in the plane of the top surface 18. In an embodiment, the device layer 12 may be exclusively comprised of single-crystal semiconductor material (e.g., single-crystal silicon) with a <111> crystal orientation.

A layer stack 20 is formed on the device layer 12 in a device region 22, and a semiconductor layer 28 is formed on the device layer 12 in a device region 30. A trench isolation region 32 is formed that cooperates with the buried insulator layer 14 to electrically isolate the device region 22 from the device region 30.

The layer stack 20 includes semiconductor layers such as a buffer layer 24 and a barrier layer 26 each containing one or more compound semiconductor layers. The buffer layer 24 and barrier layer 26 may be serially deposited using an epitaxial growth process, such as metalorganic chemical vapor deposition, vapor phase epitaxy, or molecular beam epitaxy, to form the layer stack. A thin nucleation layer of, for example, aluminum nitride may be formed on the device layer 12 before forming the layer stack 20. The device layer 12 provides a seed for the epitaxial growth. In an embodiment, the layer stack 20 may be epitaxial grown in both device regions 22, 30, and removed from the device region 30 by etching with the layer stack 20 in device region 22 covered and protected by a dielectric layer.

The buffer layer 24 and barrier layer 26 may each have a crystal structure that is single crystal or, alternatively, a crystal structure that is substantially single crystal with varying levels of crystalline defectivity present. The buffer layer 24 may contain a binary III-V compound semiconductor material, such as gallium nitride, aluminum nitride, aluminum gallium nitride, or a combination of these materials, that is tailored in terms of material composition, doping, and/or layer thickness to accommodate lattice mismatch, thermal property differences, and mechanical property differences between the material of the substrate 10 and the material of a channel layer included at the top of the buffer layer. The barrier layer 26, which is disposed over the buffer layer 24, may contain a ternary III-V compound semiconductor, such as aluminum gallium nitride with 15 atomic percent aluminum to 35 atomic percent aluminum, that provides an heterogenous interface with the buffer layer 24 of different composition. The buffer layer 24 may include an undoped layer of III-V compound semiconductor (e.g., undoped gallium nitride) immediately adjacent to the barrier layer 26.

In an embodiment, the semiconductor layer 28 may be formed by a selective epitaxial growth (SEG) process in which semiconductor material nucleates for epitaxial growth from the exposed surface of the device layer 12. The layer stack 20 in the device region 22 may be covered and protected by a dielectric layer, such as a layer of silicon nitride, that prevents epitaxial growth. In an embodiment, the section of the device layer 12 in device region 30 may be doped to have n-type conductivity before forming the semiconductor layer 28.

The semiconductor layer 28 may be comprised of a single-crystal semiconductor material, such as single-crystal silicon, and may be in situ doped during epitaxial growth with an electrically-active dopant, such as an n-type dopant (e.g., phosphorus or arsenic). In an alternative embodiment, the semiconductor layer 28 may be non-selectively grown, followed by planarization with chemical-mechanical polishing that includes removal from the device region 22.

The trench isolation region 32, which may be formed at the juncture between the layer stack 20 and the semiconductor layer 28, may extend through the device layer 12 and into the buried insulator layer 14. The trench isolation region 32 may contain a dielectric material deposited by chemical vapor deposition into an etched trench, polished, and deglazed. The dielectric material contained in the trench isolation region 32 may comprise silicon dioxide.

The layer stack 20 in the device region 22 has a top surface 21, and the semiconductor layer 28 in the device region 30 has a top surface 27. In an embodiment, the top surface 21 of the layer stack 20 may be coplanar with the top surface 27 of the semiconductor layer 28. In an embodiment, the top surface 21 of the layer stack 20 may be substantially coplanar with the top surface 27 of the semiconductor layer 28. In an embodiment, the top surface 21 of the layer stack 20 and the top surface 27 of the semiconductor layer 28 may differ in elevation by about 100 nanometers (nm) to about 500 nm, which may be considered to constitute substantially coplanarity.

Figure 2:
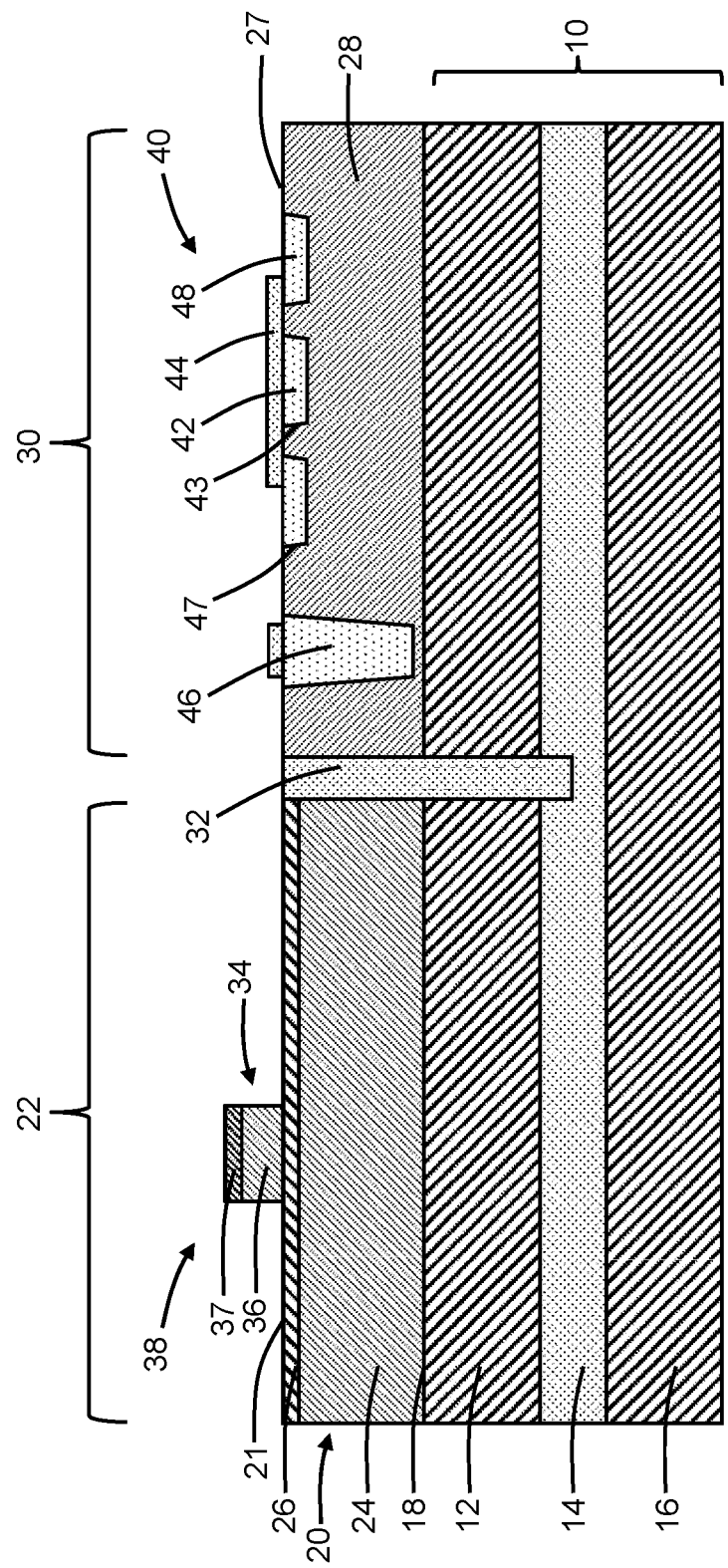
FIG. 2 is a cross-sectional view of the structure at a fabrication stage subsequent to FIG. 1.

With reference to FIG. 2 in which like reference numerals refer to like features in FIG. 1 and at a subsequent fabrication stage, a device structure 40 may be formed in device region 30. In an embodiment, the device structure 40 may be a Schottky diode that includes a doped region 42, a silicide layer 44 providing a Schottky contact with the doped region 42 that defines an anode, a doped region 46 defining a cathode, and a doped region 48 providing a guard ring that surrounds the doped region 42. The silicide layer 44 may be formed by a silicidation process, the doped regions 42, 46 may be formed in the semiconductor layer 28 by a masked implantation, and the doped region 48 may be formed in the semiconductor layer 28 by a separate masked implantation. The doped region 46 may have the same conductivity type as the semiconductor layer 28 and contain a higher dopant concentration than the semiconductor layer 28. The doped region 42 is doped to have an opposite conductivity type from the semiconductor layer 28 to define a p-n junction 43, and the doped region 48 is also doped to have an opposite conductivity type from the semiconductor layer 28 to define a p-n junction 47. For example, the doped regions 42, 48 may be doped to have p-type conductivity if the semiconductor layer 28 has n-type conductivity.

A device structure 38 is formed in the device region 22. The semiconductor layer 28 may be covered and protected by a dielectric layer during the formation of the device structure 38. In an embodiment, the device structure 38 may be an enhancement-mode high-electron-mobility transistor (HEMT). In an embodiment, the device structure 38 may include a gate structure 34 on the layer stack 20. The gate structure 34 may include a gate 36 positioned in contact with the barrier layer 26 and a gate metal layer 37 positioned on and over the gate 36. The gate 36 may be comprised of a doped III-V compound semiconductor, such as p-type gallium nitride or p-type aluminum-gallium-nitride doped with magnesium, and the gate metal layer 37 may be comprised of one or more metals, such as aluminum-copper, titanium nitride, titanium, etc. In an embodiment, the gate 36 may be formed by patterning a layer of the doped III-V compound semiconductor that is epitaxially grown on the layer stack 20 either before or after forming the semiconductor layer 28.

In the representative embodiment, the gate 36 is positioned on the barrier layer 26 at the top surface 21 of the layer stack 20. In an alternative embodiment, barrier layer 26 may be thinned beneath the gate 36 with an optional insulator layer (e.g., a silicon nitride layer) applied between the gate 36 and thinned barrier layer 26. In an embodiment, the device structure 38 may be operated in enhancement mode (E-mode) by adjusting the threshold voltage such that the device structure 38 is turned off when the gate 36 is unbiased. In an embodiment, the device structure 38 may be operated in depletion mode (D-mode) by adjusting the threshold voltage such that the device structure 38 is turned off by the application of a negative voltage to the gate 36. In an alternative embodiment, a mixture of E-mode device structures 38 and D-mode device structures 38 may be integrated in the device region 22. In an alternative embodiment, passive device structures, such as Schottky diodes, may be integrated into the device region 22.

Middle-of-line processing and back-end-of-line processing follow, which includes formation of contacts, vias, and wiring for an interconnect structure positioned over the substrate 10 and connected to the device structures 38, 40.

The buried insulator layer 14 electrically isolates both the device structure 38 and the device structure 40 from the handle substrate 16. With regard to the shared electrical isolation, the buried insulator layer 14 is positioned in a vertical direction between the device structure 38 and the handle substrate 16, and the buried insulator layer 14 is also positioned in a vertical direction between the device structure 40 and the handle substrate 16. The device structure 38 and the device structure 40 are formed on the same device layer 12 with the layer stack 20 formed on the device layer 12 in device region 22 and the semiconductor layer 28 also formed on the device layer 12 in device region 30. The utilization of the device layer 12 with only a <111> crystal orientation permits the integration of the device structures 38, 40 absent a complex manufacturing process, such as wafer bonding, or the use of an engineered or hybrid substrate (e.g., an SOI substrate with one or more crystal orientations for the device layer).

Monolithic co-integration of the device structures 38, 40 on the same device layer 12 may provide both a low-cost construction and high-performance devices with improved operational parameters. A Schottky diode as the co-integrated device structure 40 may exhibit a low forward voltage drop and a low stored charge in comparison with a Schottky diode formed using a III-V compound semiconductor material, such as gallium nitride. The parametric improvements provided by a smaller bandgap for silicon in comparison with gallium nitride may result in a reduced power loss and improved reliability during operation.

In an alternative embodiment, the device structure 40 formed using the semiconductor layer 28 may be a junction diode that exhibits low leakage as a consequence of being formed using the semiconductor layer 28. In an alternative embodiment, the device structure 40 formed using the semiconductor layer 28 may be a bipolar junction transistor or a heterojunction bipolar transition with either a vertical or lateral arrangement of the collector, emitter, and base and with a base that is doped to have either p-type conductivity or n-type conductivity. In an alternative embodiment, the device structure 40 formed using the semiconductor layer 28 may be a silicon-controlled rectifier. In an alternative embodiment, the device structure 40 may be an insulated-gate bipolar transistor. In an alternative embodiment, the device structure 40 may be a diffused resistor. In an alternative embodiment, the device structure 40 may be a junction field-effect transistor. In an alternative embodiment, device structures 40 of multiple different types may be formed using the semiconductor layer 28.

Figure 3:
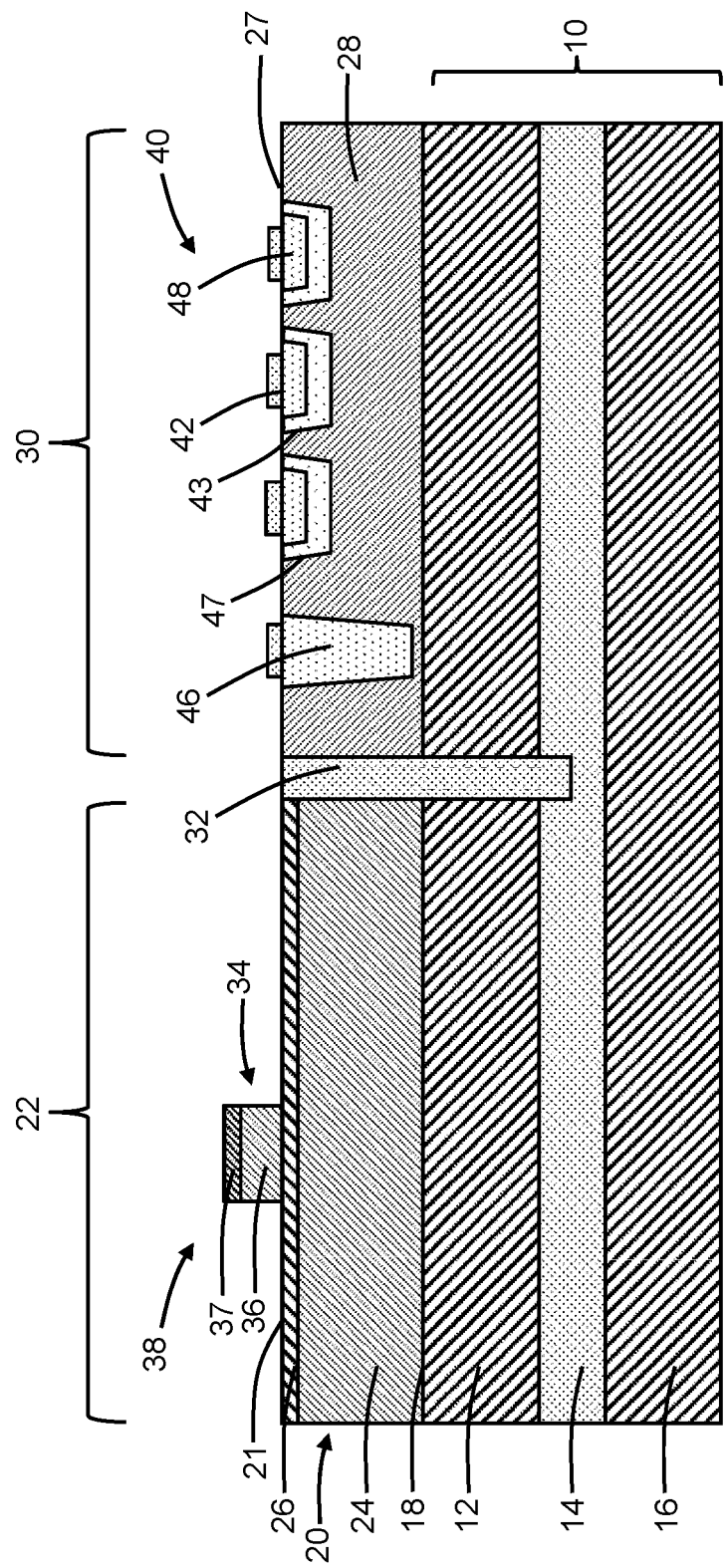
FIG. 3 is a cross-sectional view of a structure in accordance with alternative embodiments of the invention.

With reference to FIG. 3 in which like reference numerals refer to like features in FIG. 2 and in accordance with alternative embodiments, the device structure 40 may be a lateral bipolar junction transistor in which the doped region 42 defines an emitter, the doped region 46 participates in defining a base, and the doped region 48 provides a collector that surrounds the emitter. The doped region 42, which may have overlapped sections of different dopant concentration, is doped to have an opposite conductivity type from the semiconductor layer 28 to define a p-n junction. For example, the doped region 42 may be doped to have p-type conductivity if the semiconductor layer 28 has n-type conductivity.

Figure 4:
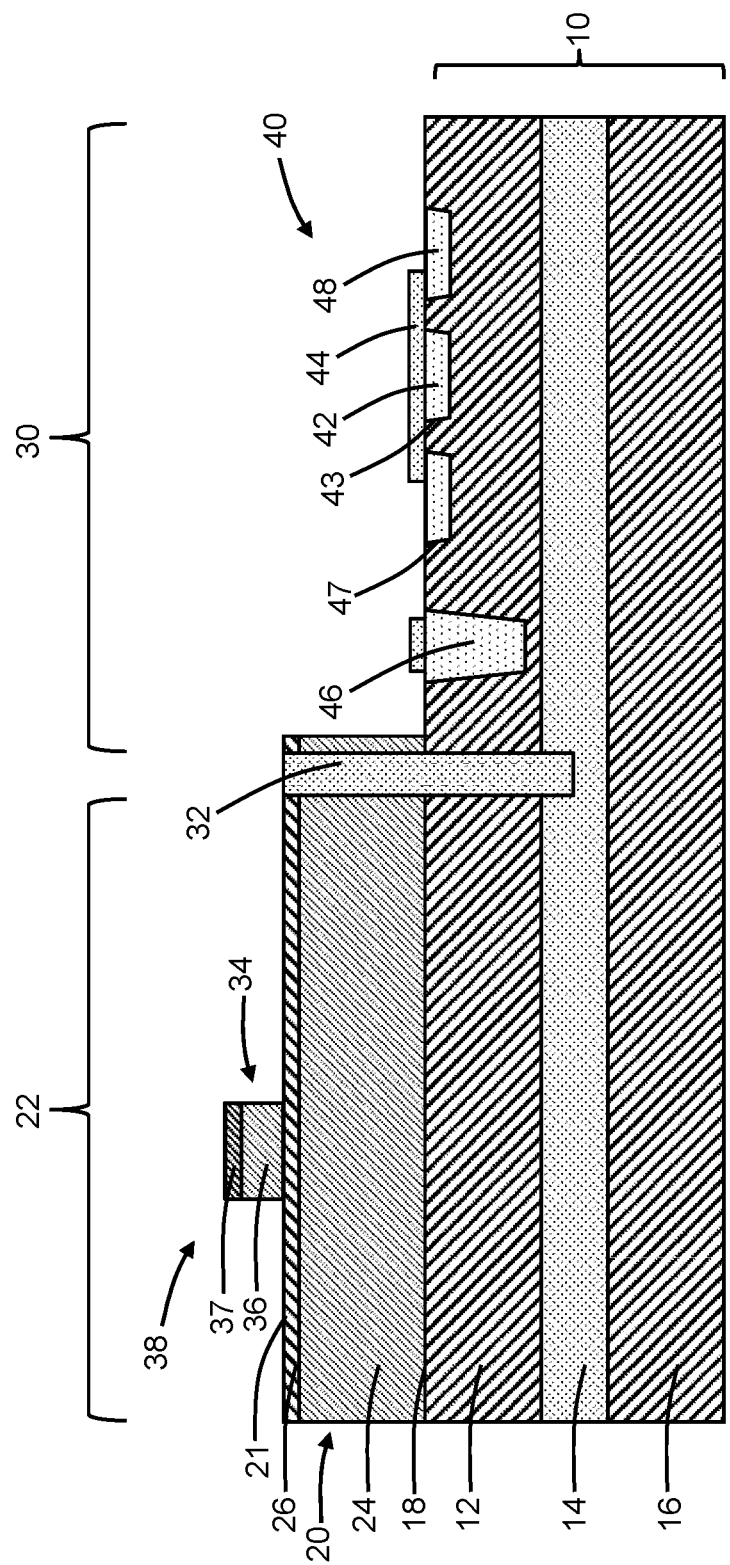
FIGS. 4 and 5 are cross-sectional views of structures in accordance with alternative embodiments of the invention.
Figure 5:
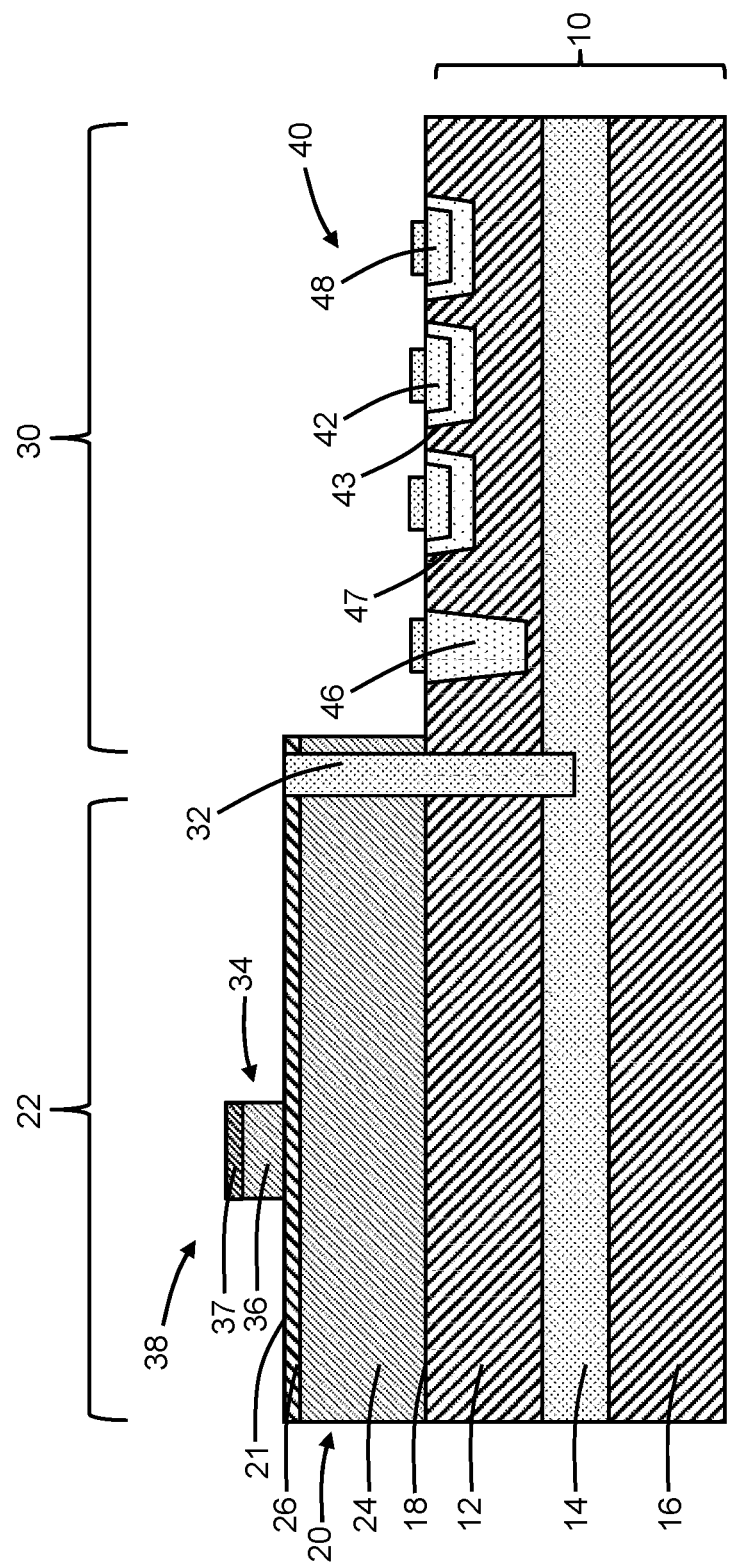

With reference to FIGS. 4, 5 in which like reference numerals refer to like features in FIG. 2 and in accordance with alternative embodiments, the device structure 40 may be formed using the device layer 12 in device region 30 instead of the semiconductor layer 28. In this instance, the semiconductor layer 28 is not formed in the device region 30, which leaves the device layer 12 accessible for formation of the device structure 40. The top surface 21 of the layer stack 20 and the top surface 18 of the device layer 12 may differ in elevation by more than 500 nm.

As shown in FIG. 4, the device structure 40 formed using the device layer 12 in device region 30 may be a Schottky diode. As shown in FIG. 5, the device structure 40 formed using the device layer 12 in device region 30 may be a bipolar junction transistor.

Figure 6:
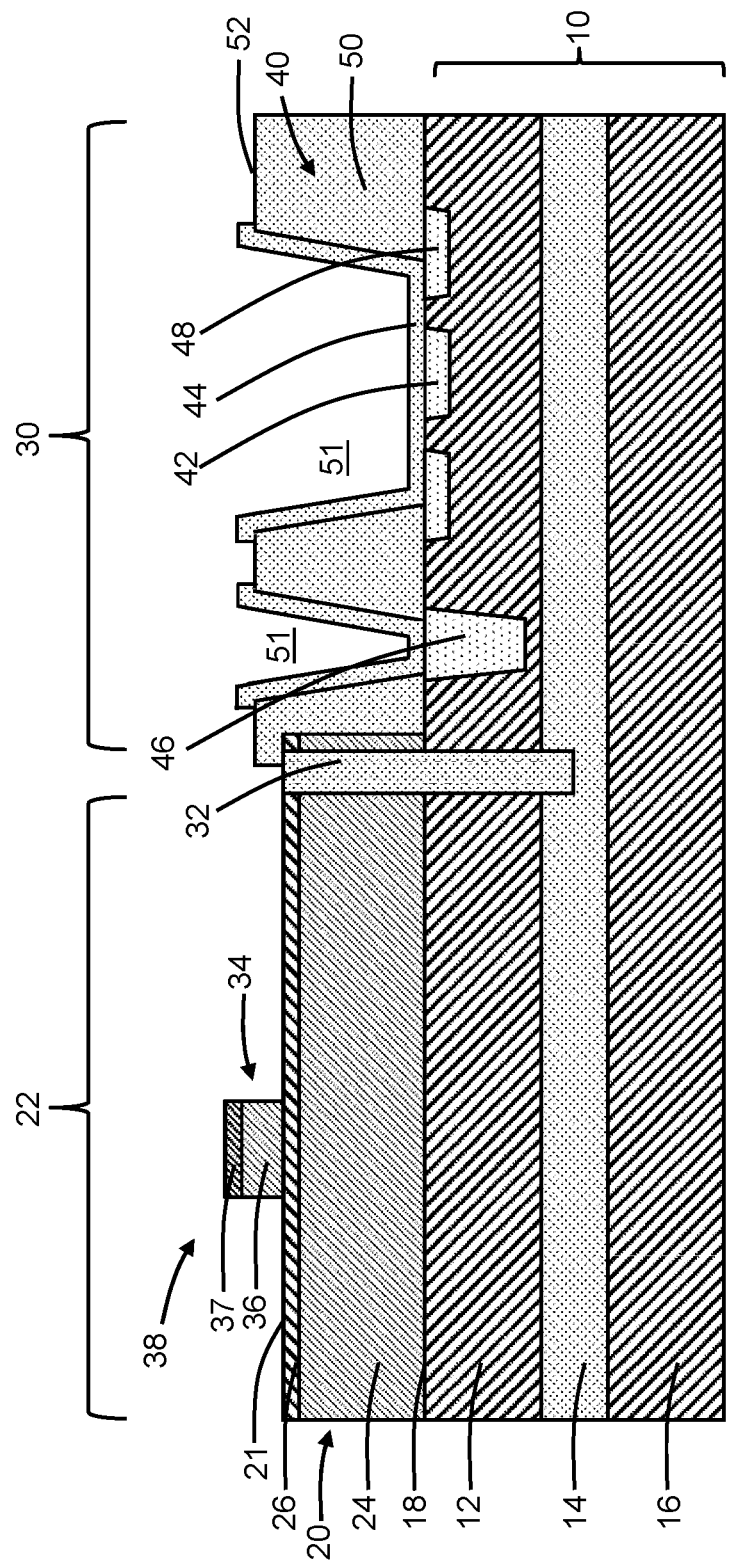
FIG. 6 is a cross-sectional view of a structure in accordance with alternative embodiments of the invention.

With reference to FIG. 6 in which like reference numerals refer to like features in FIG. 4 and in accordance with alternative embodiments, a dielectric layer 50 may be formed on the device layer 12 in the device region 30. The dielectric layer 50 is comprised of a dielectric material, such as silicon dioxide, and has a top surface 52. The dielectric material of the dielectric layer 50 may be deposited by, for example, chemical vapor deposition and then planarized. The doped regions 42, 46, 48 may be accessed through trenches 51 that are patterned in the dielectric layer 50 and that penetrate fully through the dielectric layer 50 from the top surface 52 to the device layer 12. In an alternative embodiment, the device structure 40 may be a bipolar junction transistor instead of a Schottky diode.

In an embodiment, the top surface 21 of the layer stack 20 and the top surface 52 of the dielectric layer 50 in the device region 30 may be coplanar. In an embodiment, the top surface 21 of the layer stack 20 may be substantially coplanar with the top surface 52 of the dielectric layer 50 in the device region 30. In an embodiment, the top surface 21 of the layer stack 20 and the top surface 52 of the dielectric layer 50 in the device region 30 may differ in elevation by about 100 nm to about 500 nm, which may be considered to constitute substantially coplanarity.

Figure 7:
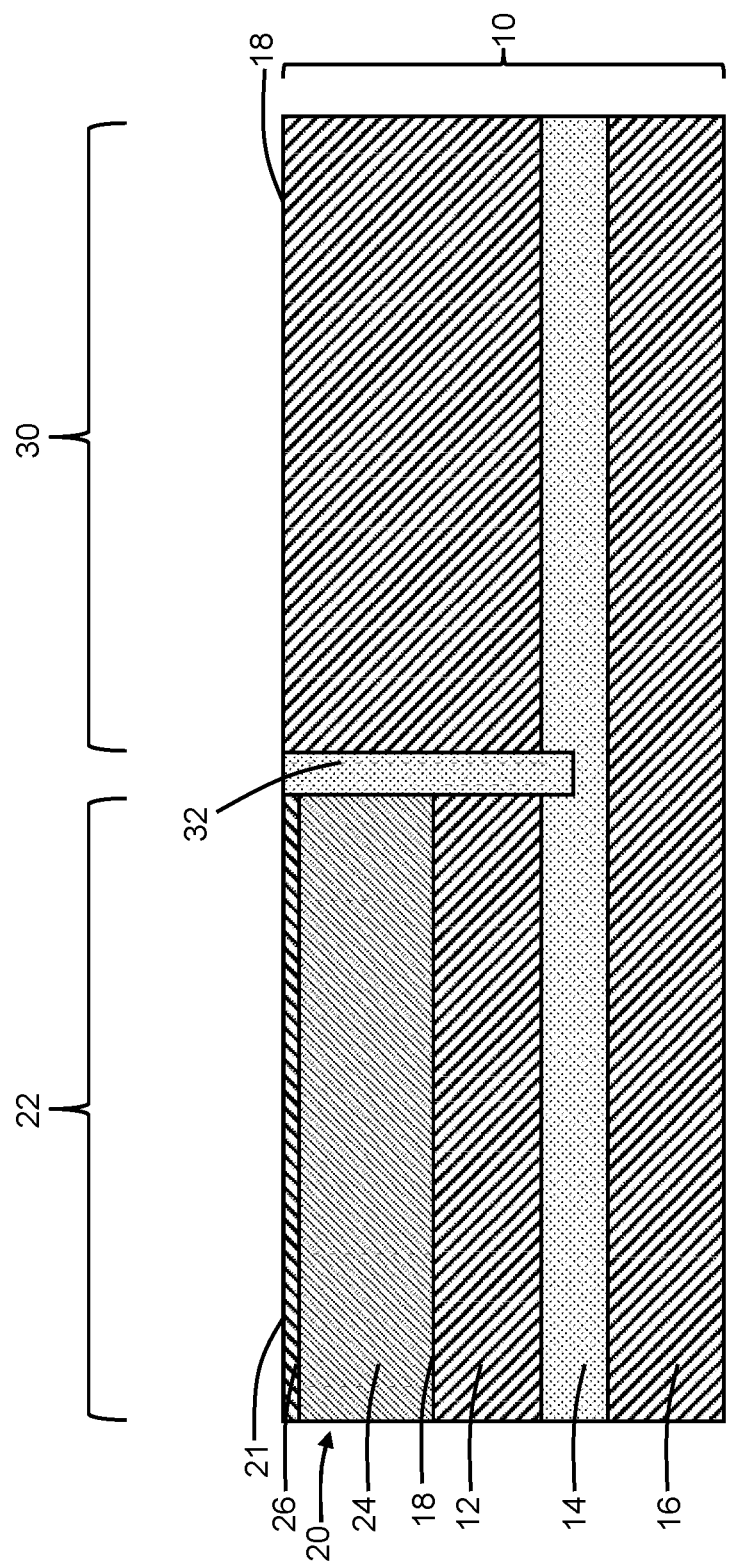
FIG. 7 is a cross-sectional view of a structure in accordance with alternative embodiments of the invention.

With reference to FIG. 7 in which like reference numerals refer to like features in FIG. 1 and in accordance with alternative embodiments, the device layer 12 may be thinned from its original thickness in device region 22 before forming the layer stack. In device region 30, the device layer 12 retains its original thickness. In this instance, the semiconductor layer 28 is not formed in the device region 30, and the original thickness of the device layer 12 is greater than the thickness of the layer stack 20.

In an embodiment, the top surface 21 of the layer stack 20 and the top surface 18 of the device layer 12 in the device region 30 may be coplanar. In an embodiment, the top surface 21 of the layer stack 20 may be substantially coplanar with the top surface 18 of the device layer 12 in the device region 30. In an embodiment, the top surface 21 of the layer stack 20 and the top surface 18 of the device layer 12 in the device region 30 may differ in elevation by about 100 nm to about 500 nm, which may be considered to constitute substantially coplanarity.

Figure 8:
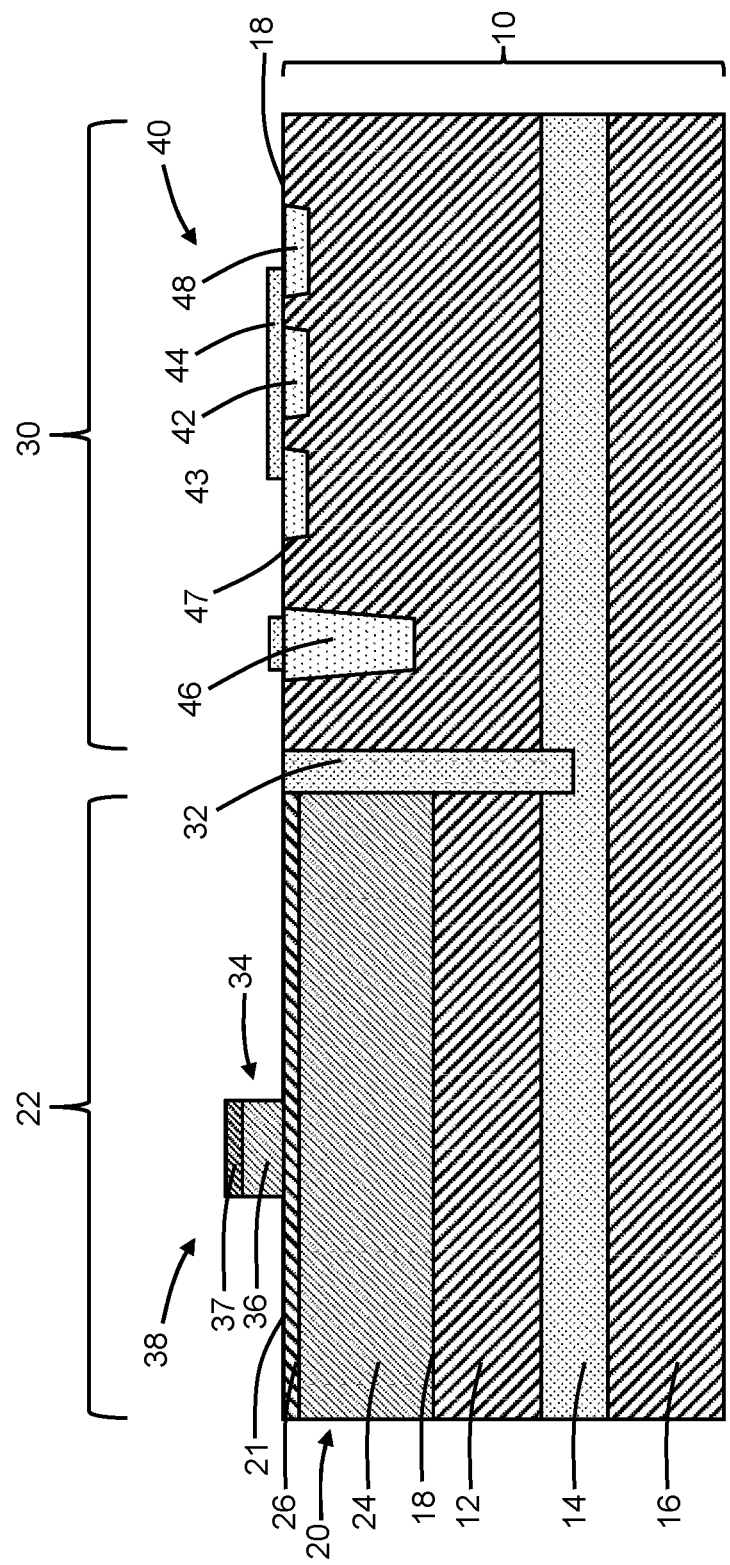
FIG. 8 is a cross-sectional view of the structure at a fabrication stage subsequent to FIG. 7.

With reference to FIG. 8 in which like reference numerals refer to like features in FIG. 7 and at a subsequent fabrication stage, processing continues to form the device structures 38, 40. In the device region 30, the device structure 40 is formed using the semiconductor material of the device layer 12, which may be doped (e.g., n-type doping) to facilitate device formation.

Figure 9:
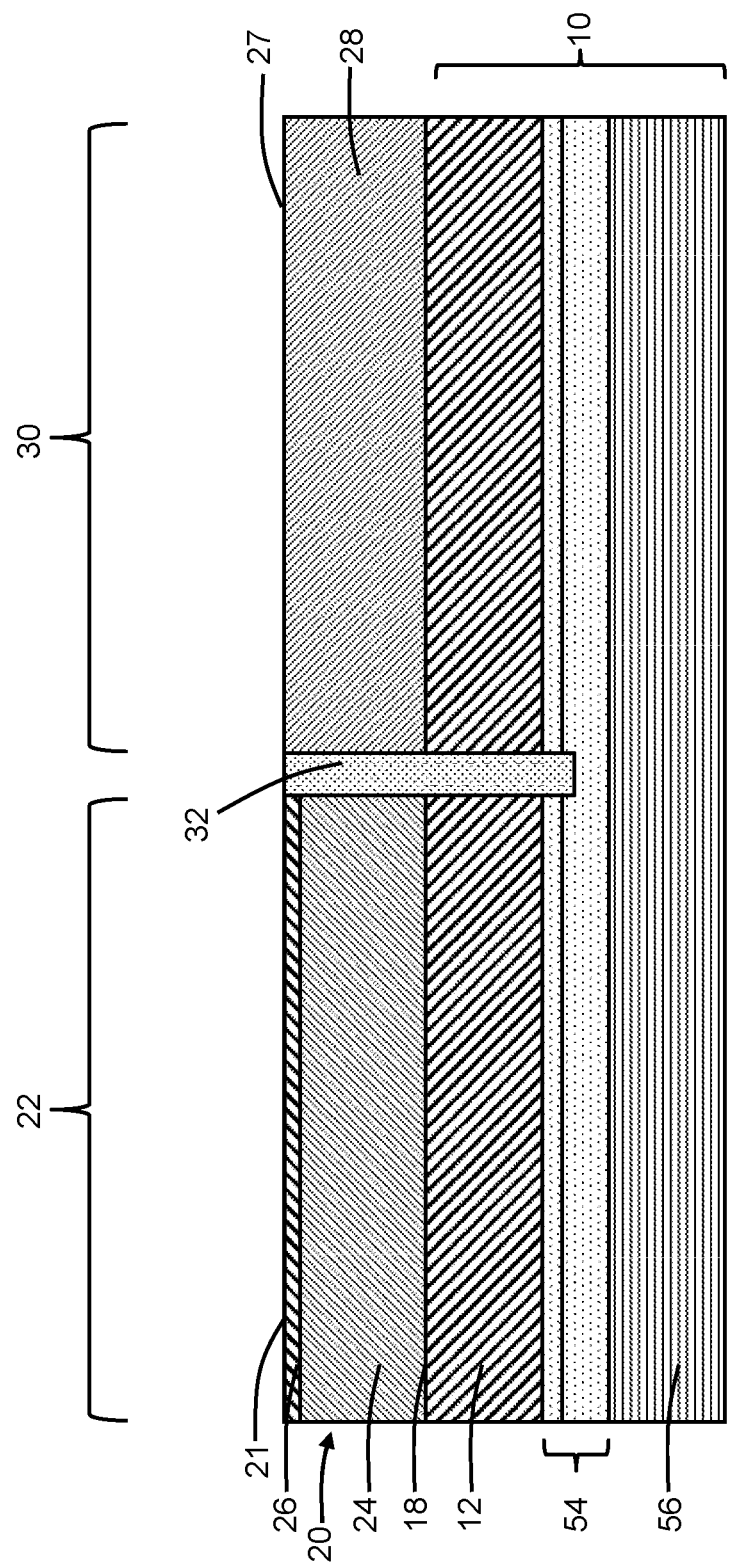
FIG. 9 is a cross-sectional view of a structure in accordance with alternative embodiments of the invention.

With reference to FIG. 9 in which like reference numerals refer to like features in FIG. 1 and in accordance with alternative embodiments, the substrate 10 may be an engineered substrate that includes a handle substrate 56 comprised of a polycrystalline ceramic material that is closely matched to the thermal expansion characteristics of the materials of the layer stack 20. In an embodiment, the handle substrate 56 may be comprised of polycrystalline aluminum nitride, which is closely matched to the thermal expansion characteristics of gallium nitride. In an embodiment, the handle substrate 56 may be comprised of polycrystalline silicon carbide, which is also closely matched to the thermal expansion characteristics of gallium nitride. The handle substrate 56 is covered by a layer stack 54 including engineered layers, such as layers containing silicon dioxide, silicon nitride, polysilicon, etc. The device layer 12 is positioned on the layer stack 54.

Figure 10:
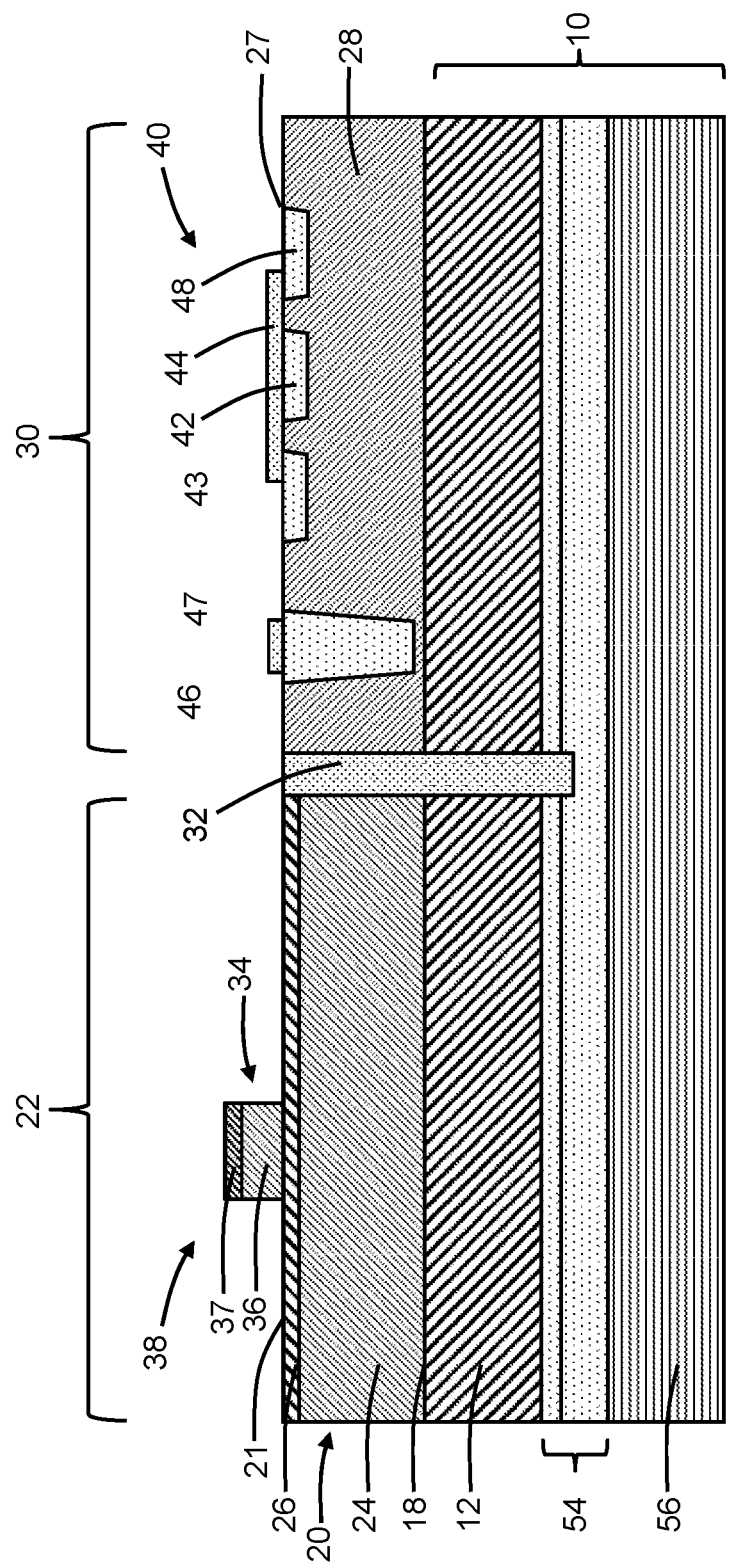
FIG. 10 is a cross-sectional view of the structure at a fabrication stage subsequent to FIG. 9.

With reference to FIG. 10 in which like reference numerals refer to like features in FIG. 9 and at a subsequent fabrication stage, processing continues to form the layer stack 20, to optionally form the semiconductor layer 28, and to form the device structure 38, 40.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/- 10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a substrate including a device layer, a handle substrate, and a buried insulator layer between the handle substrate and the device layer;
   a first semiconductor layer on the device layer in a first device region, the first semiconductor layer comprising a III-V compound semiconductor material;
   a second semiconductor layer on the device layer in a second device region, the second semiconductor layer comprising silicon;
   a high-electron-mobility transistor including a gate structure on the first semiconductor layer; and
   a second device structure including a doped region in the second semiconductor layer, the doped region and the second semiconductor layer defining a p-n junction.

2. The structure of claim 1 wherein the second device structure is a Schottky diode.

3. The structure of claim 1 wherein the second device structure is a bipolar junction transistor.

4. The structure of claim 1 wherein the device layer comprises single-crystal silicon with a <111> crystal orientation, and the silicon of the second semiconductor layer is single crystal with a <111> crystal orientation.

5. The structure of claim 1 wherein the III-V compound semiconductor material comprises gallium nitride.

6. The structure of claim 1 wherein the first semiconductor layer has a first top surface, the second semiconductor layer has a second top surface, and the first top surface and the second top surface are substantially co-planar.

7. The structure of claim 1 wherein the first semiconductor layer has a first top surface, the second semiconductor layer has a second top surface, and the first top surface and the second top surface differ in elevation by about 100 nanometers to about 500 nanometers.

8. The structure of claim 1 wherein the handle substrate comprises a polycrystalline ceramic material, and the buried insulator layer comprises a plurality of engineered layers.

9. A method comprising:
   providing a substrate including a device layer, a handle substrate, and a buried insulator layer between the handle substrate and the device layer;
   forming a first semiconductor layer on the device layer in a first device region, wherein the first semiconductor layer comprises a III-V compound semiconductor material;

forming a second semiconductor layer on the device layer in a second device region, wherein the second semiconductor layer comprises silicon;

forming a high-electron-mobility transistor including gate structure on the first semiconductor layer; and forming a second device structure including a doped region in the second semiconductor layer, wherein the doped region and the second semiconductor layer define a p-n junction.

10. The method of claim 9 wherein forming the first semiconductor layer on the device layer in the first device region comprises:

epitaxially growing the first semiconductor layer in the first device region and the second device region; and removing the first semiconductor layer from the second device region.

11. The method of claim 10 wherein the first semiconductor layer is removed from the second device region before forming the second semiconductor layer.

12. The method of claim 9 wherein the first semiconductor layer has a first top surface, the second semiconductor layer has a second top surface, and the first top surface and the second top surface differ in elevation by about 100 nanometers to about 500 nanometers.

13. The method of claim 9 wherein the device layer comprises single-crystal silicon with a <111> crystal orientation, and the silicon of the second semiconductor layer is single crystal with a <111> crystal orientation.

\* \* \* \* \*